United States Patent [19]
Pettingell

[11] Patent Number: 4,500,031
[45] Date of Patent: Feb. 19, 1985

[54] METHOD AND APPARATUS FOR MANUFACTURING A HOT SPOT THERMOCOUPLE

[75] Inventor: James T. Pettingell, Escondido, Calif.

[73] Assignee: Robert D. Hancock, Incline Village, Nev.

[21] Appl. No.: 383,515

[22] Filed: Jun. 1, 1982

[51] Int. Cl.³ .............................................. B23K 31/02
[52] U.S. Cl. .................................... 228/179; 228/5.1; 228/44.1 A; 219/56.21; 140/112
[58] Field of Search ................ 228/4.5, 6 A, 5.1, 179, 228/44.1 A; 219/56.21, 56.22, 56.1; 29/756, 745; 140/92.1, 112

[56] References Cited
U.S. PATENT DOCUMENTS
3,512,248 5/1970 Nagy et al. .......................... 228/5.1
3,775,579 11/1973 Burghart et al. ................. 219/56.22

FOREIGN PATENT DOCUMENTS
1116184 9/1955 Fed. Rep. of Germany ...... 140/112

Primary Examiner—Nicholas P. Godici
Assistant Examiner—P. Weston Musselman, Jr.
Attorney, Agent, or Firm—Fitch, Even, Tabin & Flannery

[57] ABSTRACT

Method and apparatus for constructing a hot spot thermocouple includes setup and holding means for holding fine wires, a micrometer table with a microscope, welding and transfer fixtures attachable to the micrometer table for positioning the wires, and a welding device for welding and cutting the wires.

6 Claims, 8 Drawing Figures

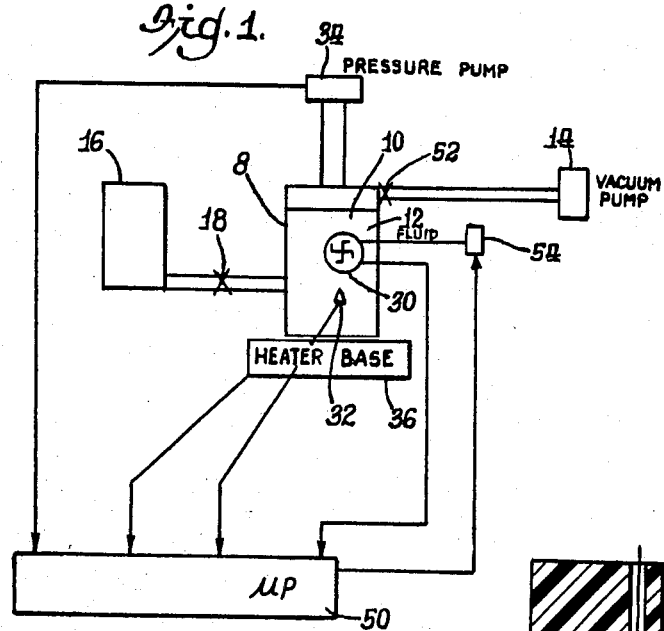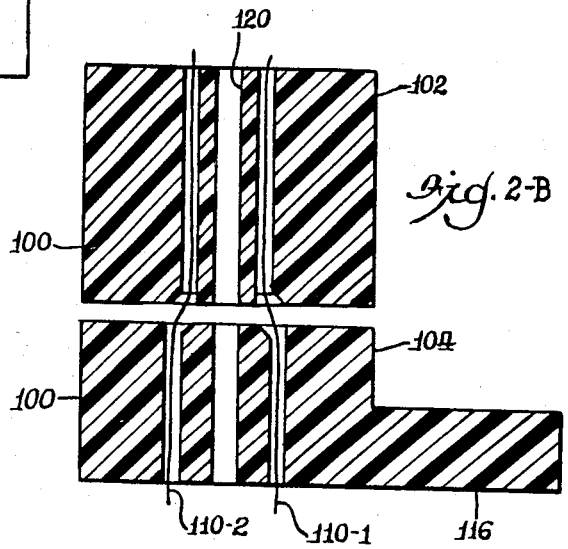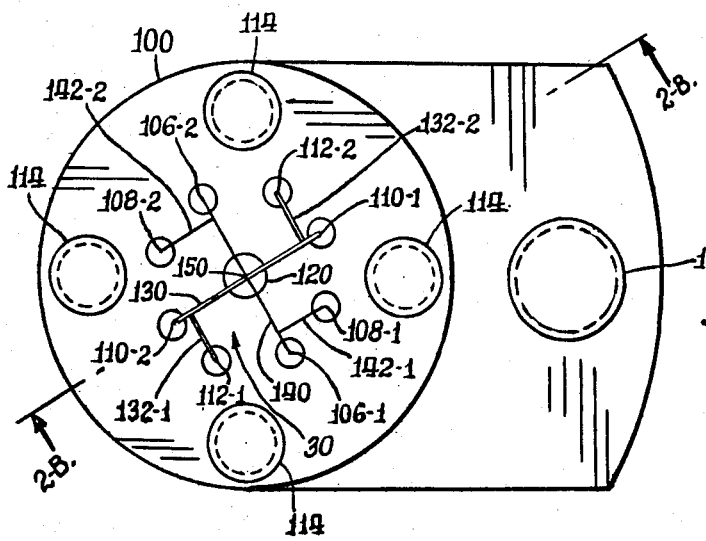

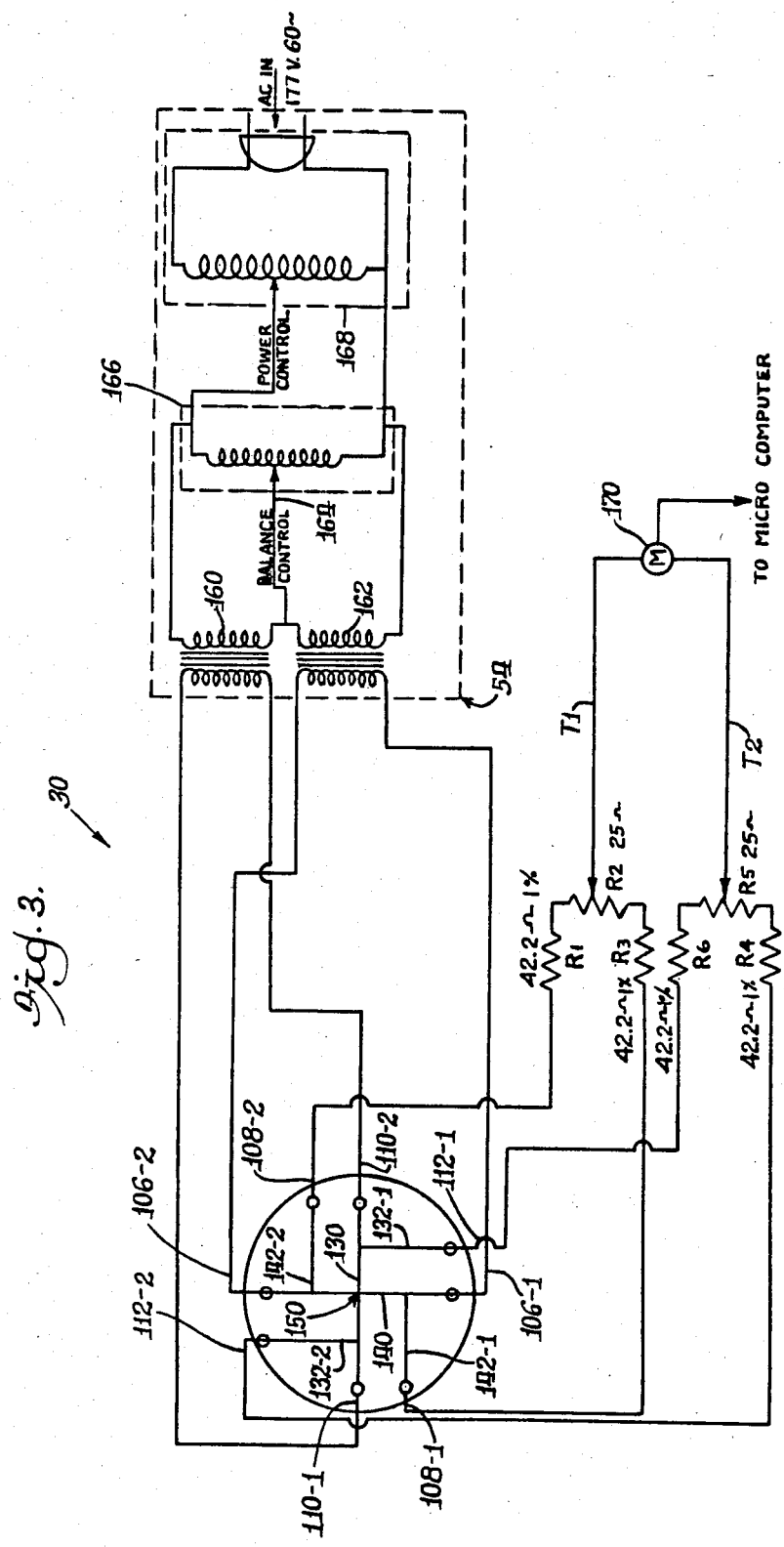

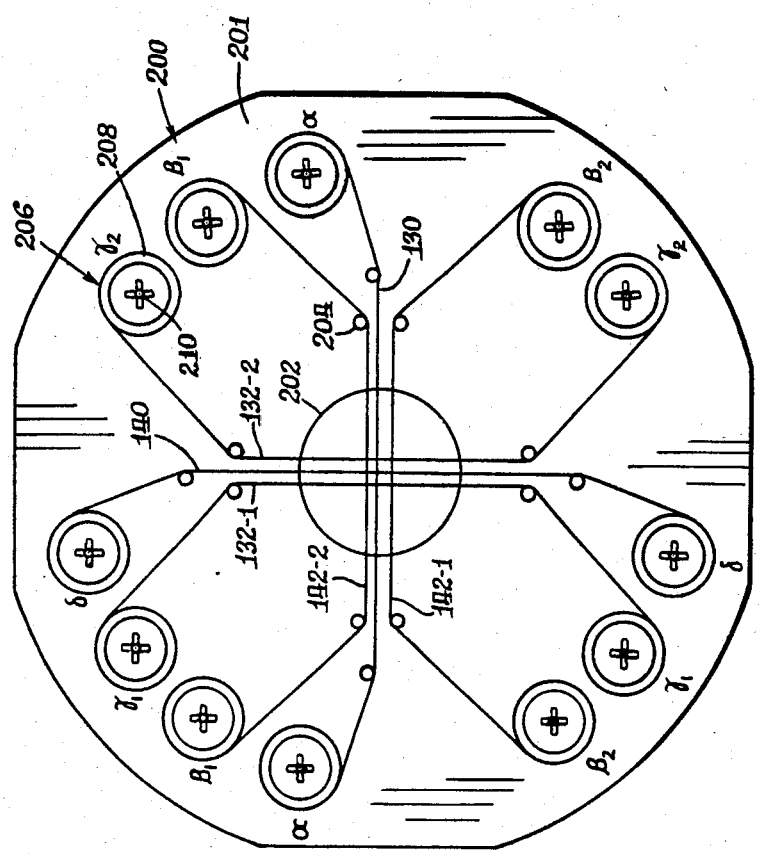
Fig. 4-B.
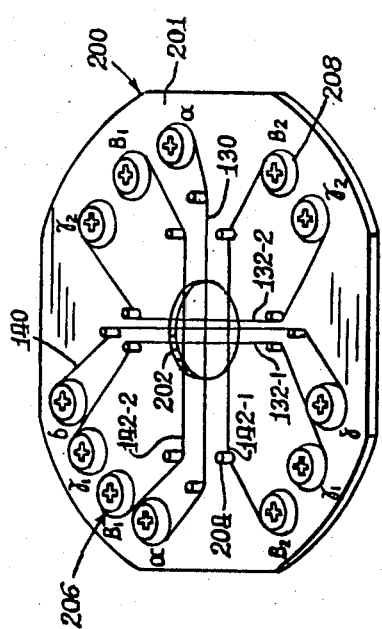
Fig. 4-A.

METHOD AND APPARATUS FOR MANUFACTURING A HOT SPOT THERMOCOUPLE

This application is related to a pending application No. 326,274 entitled "Method and Apparatus for Determining Boiling Points of Liquids," filed Dec. 1, 1981 by Robert D. Hancock.

BACKGROUND OF THE INVENTION

This invention relates generally to measuring and testing apparatus. More particularly, this invention relates to apparatus for manufacturing a hot spot thermocouple used for the determination of boiling points of liquids.

A method and apparatus for determining boiling points of liquids are described in the aforementioned co-pending application of the assignee of the present invention. The apparatus described in the co-pending application includes a whirligig hot spot thermocouple.

It is an object of the present invention to provide apparatus for manufacturing a whirligig hot spot thermocouple.

SUMMARY OF THE INVENTION

The whirligig hot spot thermocouple of the co-pending application may be heated to cause boiling at a point location in a liquid and then cooled to determine the temperature and pressure at which boiling terminates. The termination temperature and pressure define the boiling point on a pressure versus temperature diagram.

A specific construction of the hot spot thermocouple will include a pair of fine thermocouple wires, one of iron and one of constantan, for example, crossed and welded at a point. Bimetallic systems other than iron-constantan may also be used within the scope of the present invention. Alternating current is applied to the wires to heat each wire and, especially to heat the point of welding, which becomes the hot spot.

Each of the wires may be tapped on either side of the hot spot and the two taps on each wire connected through a respective potentiometer. Taps of the two potentiometers may be adjusted to have the same AC potential. The voltage difference between the two potentiometer taps is then just the DC output of the thermocouple.

The thermocouple wires are made very fine, with diameters not greater than about 0.01 inches, partly to minimize heating power requirements needed to replace heat loss from the wires to the surrounding fluid. Reduction of the wire diameters lessens the surface area the wires presented to the surrounding fluid for heat conduction. Furthermore, heat conduction from the wires to the fluid leads to convective motion of the fluid surrounding the wires, thereby obscuring precise viewing of boiling sites in the fluid. Also, large wires, having more surface area, are more likely to have small imperfections capable of acting as boiling sites, whereas it is desirable to have only the welded hot spot as a boiling site at temperatures close to the boiling point.

Fine thermocouple wires are difficult to handle. Accordingly, a specific construction of the hot spot thermocouple may comprise a non-conductive body having a flat surface and eight passages leading to the surface. Each passage securely holds an insulated lead wire, each lead made from one of the two kinds of wire used in the thermocouple. The two kinds of fine thermocouple wire are disposed upon the flat surface. Wires of each kind are joined, respectively, to four lead wires of the same kind of wire. The resulting figure on the flat surface resembles a whirligig and may be descriptively referred to as such.

Welding of the wires disposed upon the body's flat surface is greatly simplified by use of a welding fixture including a table with micrometer movement. Welding may conveniently be done with a split electrode welding head viewed under a microscope.

It is accordingly an object of the present invention to provide apparatus for constructing a whirligig hot spot thermocouple suitable for use in the determination of boiling points of liquids. This and other objects, features, and advantages of the invention will be apparent from the following description of the specific construction of a preferred embodiment as illustrated in the accompanying drawings.

DESCRIPTION OF THE DRAWINGS

FIG. 1 is a diagrammatic illustration of a specific construction of a preferred embodiment of an ebulliometric measurement system for determining boiling points of liquids;

FIG. 2-A is a plan view of a whirligig hot spot thermocouple shown as a block in FIG. 1;

FIG. 2-B is a sectional view of a whirligig hot spot detector such as is shown in FIG. 2-A, taken along line 2-B—2-B of FIG. 2-A;

FIG. 3 is a circuit diagram of electrical circuitry associated with the whirligig hot spot thermocouple shown in FIG. 2-A;

FIGS. 4-A and 4-B are isometric and detail plan views, respectively, of a wire setup and holding fixture used in accordance with the present invention in the construction of the whirligig hot spot thermocouple shown in FIGS. 2-A and 2-B;

DETAILED DESCRIPTION OF A SPECIFIC CONSTRUCTION OF A PREFERRED EMBODIMENT

Figure 6:
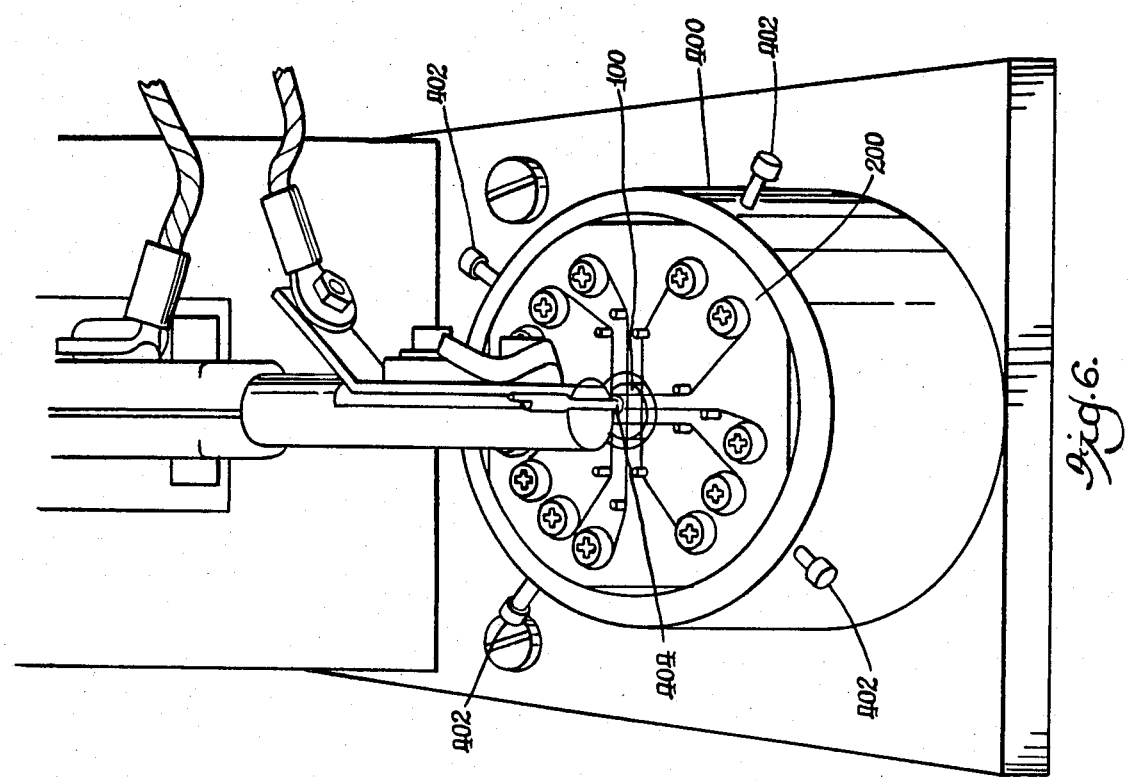
FIG. 6 is an isometric view of a transfer fixture used to hold the setup and holding fixture shown in FIGS. 4-A and 4-B during the construction of the whirligig hot spot thermocouple.

Apparatus for determining the boiling points of liquids in accordance with the aforesaid co-pending application is illustrated in FIG. 1. A vessel 8 capable of withstanding pressure forms a chamber 10 that is filled with a liquid sample 12 for which the boiling point curve is to be determined. A vacuum pump 14 may be used to evacuate the chamber 10 through a valve 52 prior to filling it from a liquid reservoir 16 through a valve 18 in order to avoid dissolved atmospheric gases in the liquid sample 12. A whirligig hot spot thermocouple 30 is disposed within the chamber 10, and a small bubble detection transducer 32 is placed in the vicinity of the whirligig hot spot thermocouple 30. The chamber 10 may be connected to a pressure pump 34 for varying the pressure in the chamber. The chamber 10 may be placed upon a heatable and coolable base 36 used for controlling the ambient temperature of the liquid sample 12 in the container 10. The pressure pump 34, heater (and cooler) base 36, transducer 32, and whirligig hot spot thermocouple 30 all provide inputs to a microprocessor 50.

FIGS. 2-A and B illustrate a preferred construction of the whirligig hot spot thermocouple 30. A nonconducting body 100, which may be made of plastic and comprised of an upper section 102 and a lower section 104, provides for holding securely four pairs of insulated lead wires 106-1, 106-2, 108-1, 108-2, 110-1, 110-2, 112-1, and 112-2 as shown in FIGS. 2-A and B. The lead wires 106, 108, 110, 112 may be held securely by providing passages from the top face of the upper portion 102 through the upper portion and through the lower portion 104, the passages in the upper portion 102 and lower portion 104 being displaced from each other when the portions are joined together, as shown particularly in FIG. 2-B. The portions may be held together by four screws 114, and the lower portion may be provided with a flange 116 tapped for securing to another surface by a screw 118. In a particular construction the lead wires 110 and 112 are iron and the lead wires 106 and 108 are constantan. Lead wires 106, 108, 110, and 112 having 0.01" diameter were used in the particular construction described herein. The body 100 may also be drilled through the upper and lower portion in a direction parallel to the passage of the eight lead wires with a hole 120, with the passages containing the lead wires disposed evenly spaced on the circumference of a circle concentrically surrounding the hole 120, as shown in FIG. 2-A.

A substantially straight piece of iron thermocouple wire 130 is disposed upon the smooth upper face of the upper body 102 across the approximate center of the hole 120 and connecting the lead wires 110-1 and 110-2. The lead wires 110-1 and 110-2 are also both made of iron in order to avoid dissimilar metal junctions with the thermocouple wire 130. The two lead wires 110 are welded to the thermocouple wire 130, as will be described. A pair of iron tap wires 132-1 and 132-2 are welded to a second pair of iron lead wires 112-1 and 112-2, respectively, which are disposed next to the pair of wires 110. The lead wires 112-1 and 112-2 are approximately oppositely located across the face of the upper section 102 with respect to the hole 120. The iron tap wires 132 are welded to the thermocouple wire 130 at approximately equal distances from the center of the hole 120, thereby tapping the thermocouple wire 130. The wires 110 are the iron heater wires, and the wires 112 are the iron sensing wires.

A fine substantially straight piece of constantan thermocouple wire 140 is disposed on the upper face of the upper body 102 at substantially right angles to the iron thermocouple wire 130. The constantan thermocouple wire 140 is welded to the pair of wires 106, which are constantan heater wires, in the same manner that the iron thermocouple wire 130 is welded to the iron heater wires 110. A pair of constantan tap wires 142-1 and 142-2 tap the constantan thermocouple wire 140 and are welded to the lead wires 108, which are also of constantan, thereby making a construction of constantan wire similar to and at substantially right angles with respect to the construction of iron wire. The iron and constantan thermocouple wires 130 and 140 are welded together at the approximate center of the hole 120, thereby forming a junction or hot spot 150.

The iron sensing wires 112-1 and 112-2 connect, respectively, to a pair of resistors R6 and R4 as illustrated in FIG. 3. The two resistors R6, R4 are then connected by a potentiometer R5. The constantan sensing wires 108-1 and 108-2 are similarly connected to a pair of resistors R3 and R1 which in turn are connected by a potentiometer R2. The connections of the sensing wires 108, 112 to the resistors R1, R3, R4, R6 comprise the thermocouple reference junction. The potentiometers R2 and R5 are tapped respectively by taps T1 and T2 which together comprise the output terminals of a thermocouple sensing circuit. The resistors R1, R3, R4, and R6 all have substantially the same resistance and are maintained at substantially the same temperature, which may be measured independently.

The heater leads 106 and 110 are respectively connected to the secondary terminals of a pair of filament transformers 162 and 160, also as illustrated in FIG. 3. The primaries of the filament transformers 160, 162 are connected together and the common connection connected to a tap 164 of a variable ratio transformer 166. The other terminals of the primaries of the filament transformers 160 and 162 connect to the other output terminals of the transformer 166. The transformer 166 is then connected to an adjustable power source 168 as indicated symbolically in FIG. 3. The pair of filament transformers 160 and 162, together with the transformer 166 and the adjustable power source 168, thereby comprise a power supply 54.

Persons familiar with electrical circuits will appreciate that the potentiometers T1 and T2 may be adjusted so that there is zero AC voltage between them coming from the filament transformers 160 and 162. As a result, the voltage between the terminals T1 and T2 will be substantially only the DC output voltage produced by the whirligig hot spot thermocouple 30. This DC output voltage may be measured by a voltmeter means 170 and the result transmitted to the microprocessor 50.

The fine wires 130, 132, 140, and 142 were of 0.001" diameter in the specific construction described herein. Welding of such fine wires is difficult. As a result, it is desirable to have special equipment for assembling the whirligig hot spot thermocouple 30. FIG. 4-A and FIG. 4-B illustrate a specific construction of a wire setup and holding fixture 200 for facilitating the handling of extremely fine wire such as the thermocouple junction wires 130, 140 and tap wires 132, 142. The fixture 200 comprises an approximately circular metal plate 201, which may be made of brass, having an access hole 202 in the approximate center. Triplets of positioning pins such as pin 204 are arranged in triangles at approximately 90° intervals about the access hole, the apexes of the triangles being directed to the outer circumference of the plate 200. Twelve hold-downs such as hold-down 206 are arranged about the circumference of the plate 200. Each hold-down 206 comprises an 0-ring 208 held in place by a screw 210, the screw being adjustable to force the 0-ring against the surface of the plate 201. Wire may be held in place on the surface of the brass plate 201 by being drawn between a pair of pins such as the pin 204 and a pair of hold-downs such as the hold-down 206 so as to be held in place under tension across the access hole 202. The wires are strung with two triplets of wires at right angles to each other. In one direction an iron thermocouple wire 130 is strung between and parallel to a pair of constantan tap wires 142, whereas in the orthogonal direction a constantan thermocouple wire 140 is strung between a pair of iron tap wires 132.

Figure 5:
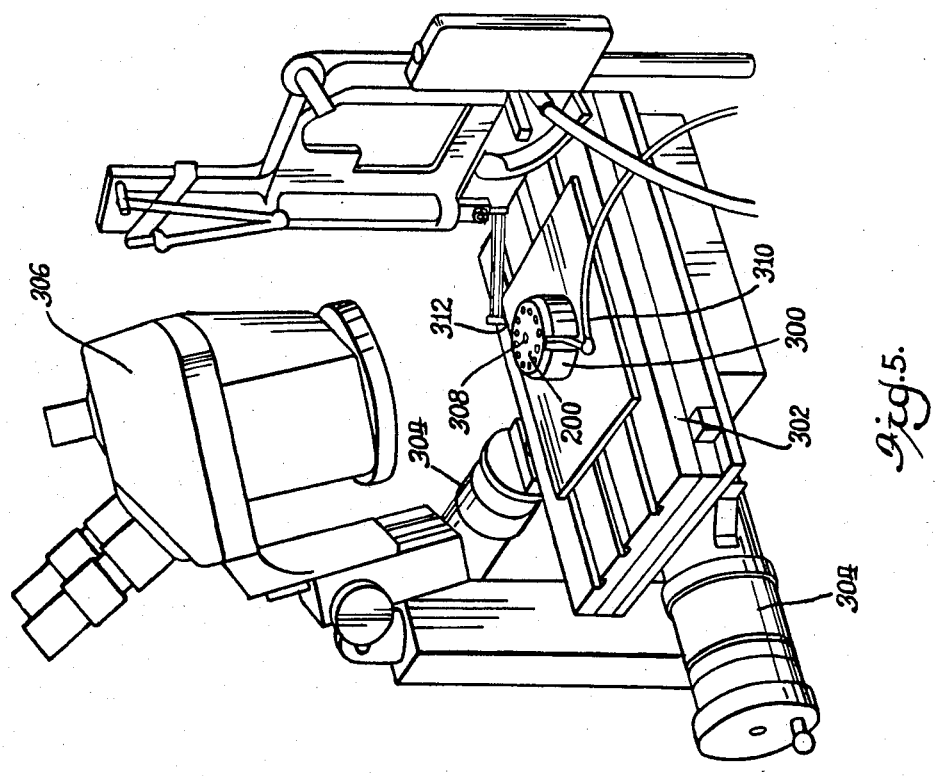
FIG. 5 is an isometric view of a welding fixture used to hold the setup and holding fixture shown in FIGS. 4-A and 4-B during the construction of the whirligig hot spot thermocouple.

The fixture 200, when loaded with wire, is then placed in a welding fixture 300 as illustrated in FIG. 5. The welding fixture 300 comprises a cylindrical body providing a seat for the fixture 200 accessible from above, and may be affixed by any convenient means to a micrometer table 302 having micrometer controls 304 disposed under a microscope 306. The welding fixture 300 includes a copper rod 308 that fits from below into the central access hole 202 of the fixture 200 to provide a lower welding electrode substantially flush with the upper face of the brass plate 201. A power cable 310 may be connected to the central rod 308.

An upper electrode 312 with a fine point tip may conveniently be positioned by a foot pedal and the power controlled by suitable means such as a hand switch.

The iron and constantan thermocouple wires 130, 140 cross in the approximate center of the fixture as shown in FIG. 4-B. The crossing point may be positioned under the upper electrode by means of micrometer table adjustments, and the thermocouple wires 130, 140 may then be welded together by lowering the upper electrode onto the junction point and applying voltage. In the construction described herein the upper electrode 312 is applied to the junction point of the thermocouple wires 130, 140 with a force of 15 grams and a voltage of between 0.570 and 0.640 AC rms volts is applied between the upper and lower electrodes 312, 308. The iron tap wires 132-1 and 132-2 are similarly welded to the iron thermocouple wire 130 and the constantan tap wires 142-1, 142-2 welded to the constantan thermocouple wire 140. Fifteen grams of force are applied for each weld and the voltages applied to the electrodes 310, 308 are between 0.450 and 0.500 volts for the constantan-on-constantan welds and between 0.690 and 0.740 volts for the iron-on-iron welds.

The fixture 200 is next placed in a transfer fixture 400 shown in the isometric view in FIG. 6. The transfer fixture 400 also comprises a cylindrical body providing a seat for the fixture 200 accessible from above. The transfer fixture 400 provides means for supporting the upper face of the non-conducting body 100 within the central hole 202 of the fixture 200. The support for the non-conducting body 100 is provided to position the central hole 120 in the upper face of the non-conducting body 100 underneath the welded intersection of the thermocouple wires 130, 140 with the leads 106, 108, 110, 112 substantially in contact with the wires of the same kind on the face of the fixture 200. Four centering screws 402 may be provided in the transfer welding fixture 400 to position the fixture 200 with respect to the non-conducting body 100. A double electrode welding head 404 having an electrode spacing of approximately 0.003" may be used to weld the thermocouple wires 130, 140 and taps 132, 142, respectively, to the lead wires 110, 106, 112, 108. The welds may be made by applying 30 grams of force and between 1.160 and 1.210 AC rms volts. Excess wire may be trimmed by application of the double electrode welding head 404 against the wire backed either by plastic or air. When the backing is plastic or air, the wires become very hot and melt because heat cannot be conducted away from the wires. Conversely, it is necessary when welding that the wires being welded be in contact with a sufficiently massive heat conductor to permit welding without severing the wires.

It will, of course, be understood that modification of the present invention in its various aspects would be apparent to those skilled in the art, some being apparent only after study and others being a matter of routine design. Persons skilled in the art will conceive of other forms and arrangements of components which will also serve the purpose of constructing hot spot thermocouples. As such, the scope of the invention should not be limited by the particular embodiment and specific construction described herein but should be defined only by the claims and equivalents thereof.

What is claimed is:

1. Apparatus for constructing a hot spot thermocouple having a body containing lead wires comprising:
    setup and holding means for holding a plurality of fine wires having diameters not greater than about 0.01 inches in fixed predetermined positions,
    a micrometer table,
    viewing means for viewing objects on said micrometer table under magnification,
    welding fixture means fixable to said micrometer table and cooperating with said setup and holding means to position said plurality of fine wires with respect to said viewing means,
    welding and cutting means cooperative with said welding fixture means for making predetermined welds among said wires in said plurality of wires, and
    transfer fixture means fixable to said micrometer table and cooperating with said setup and holding means to support the hot spot thermocouple body to make predetermined contacts between the lead wires and respective ones of said plurality of wires in substantially predetermined positions with respect to said viewing means, whereby the welding and cutting means cooperates with said transfer fixture means to make welds at said predetermined contacts and cut away excess wire.

2. Apparatus for constructing a hot spot thermocouple according to claim 1 wherein said welding and cutting means includes
    voltage control means for applying substantially predetermined AC rms voltages between 0.450 and 0.500 volts, between 0.570 and 0.640 volts, and between 0.690 and 0.740 volts to segments of said wires on said plurality of wires to create welds between predetermined pairs of said wires; and
    pressure control means for applying a force equivalent to the weight of approximately 15 grams to said predetermined pairs of wires for creating said welds.

3. A method for constructing a hot spot thermocouple having a body comprising the steps of:
    fixing a plurality of lead wires in the body,
    holding a plurality of fine wires having diameters not greater than about 0.01 inches in fixed predetermined positions with respect to each other,
    making predetermined welds among the fine wires,
    transferring the welded fine wires to a fixture holding the welded fine wires in a predetermined position with respect to the thermocouple body,
    welding said fine wires to respective predetermined ones of said plurality of lead wires and cutting away excess wire.

4. A method for constructing a hot spot thermocouple according to claim 3 wherein said fine wires comprise a first set of 3 crossing wires and a second set of 3 crossing wires.

5. A method for constructing a hot spot thermocouple according to claim 4 wherein said step of making predetermined welds includes the step of welding a center wire of said first set to a center wire of said second set and the step of welding outer wires of each said set to said center wire of the other said set.

6. Apparatus for constructing a hot spot thermocouple having a body containing lead wires comprising:
- setup and holding means for holding a plurality of fine wires having diameters not greater than about 0.01 inches in fixed predetermined relative positions,
- welding fixtures means cooperating with said setup and holding means to position said plurality of fine wires for welding,
- welding and cutting means cooperative with said welding fixture means for making predetermined welds among said wires in said plurality of wires, and
- transfer fixture means cooperating with said setup and holding means to support the hot spot thermocouple body to make predetermined contacts between the lead wires and respective ones of said plurality of wires in substantially predetermined positions, whereby the welding and cutting means cooperates with said transfer fixture means to make welds at said predetermined contacts and cut away excess wire.

* * * * *